(12) United States Patent
Abe et al.

(10) Patent No.: US 8,078,012 B2
(45) Date of Patent: Dec. 13, 2011

(54) PATTERN INSPECTION APPARATUS AND METHOD

(75) Inventors: Takayuki Abe, Kanagawa (JP); Hideo Tsuchiya, Tokyo (JP)

(73) Assignee: NuFlare Technology, Inc., Numazu-shi (JP)

( * ) Notice: Subject to any disclaimer, the term of this patent is extended or adjusted under 35 U.S.C. 154(b) by 744 days.

(21) Appl. No.: 12/212,958

(22) Filed: Sep. 18, 2008

(65) Prior Publication Data

US 2009/0087082 A1    Apr. 2, 2009

(30) Foreign Application Priority Data

Sep. 27, 2007    (JP) .................................. 2007-250651

(51) Int. Cl.
*G06K 9/20* (2006.01)
(52) U.S. Cl. ......... 382/317; 382/103; 382/190; 382/278
(58) Field of Classification Search .................. 382/103, 382/190, 209, 278
See application file for complete search history.

(56) References Cited

U.S. PATENT DOCUMENTS

| | | | | | |
|---|---|---|---|---|---|
| 4,999,495 | A | * | 3/1991 | Miyata et al. | 850/3 |
| 5,650,614 | A | * | 7/1997 | Yasutake et al. | 250/234 |
| 6,011,625 | A | * | 1/2000 | Glass | 356/496 |
| 6,590,703 | B2 | * | 7/2003 | Park et al. | 359/372 |
| 7,260,980 | B2 | * | 8/2007 | Adams et al. | 73/31.05 |

FOREIGN PATENT DOCUMENTS

JP    2007-102153    4/2007

OTHER PUBLICATIONS

U.S. Appl. No. 12/552,108, filed Sep. 1, 2009, Tsuchiya, et al.

* cited by examiner

*Primary Examiner* — Yosef Kassa
(74) *Attorney, Agent, or Firm* — Oblon, Spivak, McClelland, Maier & Neustadt, L.L.P.

(57) ABSTRACT

A pattern inspection apparatus includes a stage configured to mount a target workpiece to be inspected thereon, a sensor configured to include a plurality of light receiving elements arrayed in a second direction orthogonal to a first direction which moves relatively to the stage, and to capture optical images of the target workpiece by using the plurality of light receiving elements, an accumulation unit configured to accumulate each pixel data of the optical images overlappingly captured by the sensor at positions shifted each other in the second direction by a pixel unit, for each pixel, and a comparison unit configured to compare the each pixel data accumulated for each pixel with predetermined reference data.

10 Claims, 9 Drawing Sheets

PATTERN INSPECTION APPARATUS AND METHOD

CROSS-REFERENCE TO RELATED APPLICATION

This application is based upon and claims the benefit of priority from the prior Japanese Patent Application No. 2007-250651 filed on Sep. 27, 2007 in Japan, the entire contents of which are incorporated herein by reference.

BACKGROUND OF THE INVENTION

1. Field of the Invention

The present invention relates to a pattern inspection apparatus and a pattern inspection method. For example, it relates to an inspection apparatus and a method thereof which inspect a pattern by using a line sensor.

2. Description of Related Art

In recent years, with an increase in high integration and large capacity of a large-scale integrated circuit (LSI), a circuit line width required for semiconductor elements is becoming narrower and narrower. These semiconductor elements are manufactured by exposing and transferring a pattern onto a wafer to form a circuit by means of a reduced projection exposure apparatus (a so-called stepper or scanner) while using a master or "original" pattern (also called a mask or a reticle, and hereinafter generically called a mask) on which a circuit pattern is written, "drawn" or "formed". Therefore, in order to manufacture a mask for transfer printing a fine circuit pattern onto a wafer, an electron beam pattern writing apparatus capable of writing a fine circuit pattern needs to be employed. The pattern circuit may be directly written onto a wafer by the pattern writing apparatus. In addition to the writing apparatus using electron beams, a laser beam writing apparatus which uses laser beams to write a pattern is also under development.

Since a lot of manufacturing cost is needed for the production of LSI, an improvement in yield is a crucial issue. However, as typified by a DRAM (Dynamic Random Access Memory) of 1 giga-bit class, the order of a pattern constituting the LSI has been changing from submicron to nano-meter. Then, one of major factors that decrease the yield is a pattern defect of a mask used in exposing and transferring an ultrafine pattern onto a semiconductor wafer by a photolithography technique. In recent years, with miniaturization of an LSI pattern formed on a semiconductor wafer, dimensions to be detected as a pattern defect have become extremely small. Therefore, a pattern inspection apparatus for inspecting defects of a transfer mask used in manufacturing the LSI needs to be highly accurate.

In the meanwhile, with development of multimedia technologies, the size of a liquid crystal substrate of an LCD (Liquid Crystal Display) is becoming large, e.g., 500 mm×600 mm or more, and a pattern of a TFT (Thin Film Transistor) or the like formed on the liquid crystal substrate is becoming minute. Therefore, it is increasingly required to inspect an ultra-fine pattern defect in a large area. For this reason, development of a pattern inspection apparatus which efficiently, in a short time, inspects defects of a pattern of a large-area LCD and a photomask used in manufacturing the large-area LCD is urgently required.

As an inspection method, there is known the method of comparing an optical image captured by photographing a pattern formed on a target workpiece or "sample", such as a lithography mask, at a predetermined magnification by use of a magnification optical system with design data or an optical image captured by photographing the same pattern on the target workpiece. For example, the following is known as pattern inspection methods: "die to die inspection" that compares optical image data obtained by capturing images of the same patterns at different positions on the same mask, and "die to database inspection" that inputs writing data (design pattern data), which is generated by converting pattern CAD data into an appropriate format to be input by a writing apparatus when writing a pattern on a mask, into an inspection apparatus, generates design image data (reference image) based on the input writing data, and compares the design image data with an optical image serving as measurement data obtained by capturing the image of the pattern. In the inspecting methods of the inspection apparatus, the target workpiece is placed on a stage to be scanned by a flux of light while the stage is moving to perform inspection. The target workpiece is irradiated with a flux of light from a light source and an irradiation optical system. Light transmitted through the target workpiece or reflected by the target workpiece is focused on a sensor through the optical system. The image captured by the sensor is transferred to a comparison circuit as measurement data. In the comparison circuit, after position alignment of the images, the measurement data and the reference data are compared based on an appropriate algorithm. When the measurement data is different from the reference data, it is judged that there is a pattern defect (refer to, e.g., Japanese Unexamined Patent Publication (JP-A) No. 2007-102153).

In the conventional pattern inspection apparatus, a line sensor in which a plurality of light receiving elements, for example, for 512 pixels are arrayed perpendicularly to the direction of inspection is used for capturing an optical image of an inspection target workpiece. However, as for each element arranged in the line sensor, there is variation of optical properties among the elements. In particular, elements at the sensor end have large variation of the properties compared with elements at the inner side. Therefore, if the inspection is performed accepting a light quantity received by each element without question, there is a possibility of inducing a pseudo defect.

As mentioned above, in the sensors, such as a line sensor, in which a plurality of light receiving elements are arranged, there is optical properties variation among the elements. Specially, elements at the sensor end have large variation of optical properties compared with elements at the inner side. Therefore, if a light quantity received by each element is used as it is as measurement data, there is a problem that errors of measurement data will become large. Consequently, there occurs a problem of inducing a pseudo defect when such measurement data is used for inspection.

BRIEF SUMMARY OF THE INVENTION

It is an object of the present invention to provide an inspection apparatus and inspection method that suppresses errors of measurement data resulting from the variation among light receiving elements.

In accordance with one aspect of the present invention, a pattern inspection apparatus includes a stage configured to mount a target workpiece to be inspected thereon, a sensor configured to include a plurality of light receiving elements arrayed in a second direction orthogonal to a first direction which moves relatively to the stage, and to capture optical images of the target workpiece by using the plurality of light receiving elements, an accumulation unit configured to accumulate each pixel data of the optical images overlappingly captured by the sensor at positions shifted each other in the second direction by a pixel unit, for each pixel, and a comparison unit configured to compare the each pixel data accumulated for each pixel with predetermined reference data.

In accordance with another aspect of the present invention, a pattern inspection apparatus includes a stage configured to mount a target workpiece to be inspected thereon, a plurality of sensors configured to respectively include a plurality of light receiving elements arrayed in a second direction orthogonal to a first direction which moves relatively to the stage, to be arranged at positions shifted each other in the second direction by a pixel unit of a number of elements fewer than a number of the plurality of light receiving elements, and to respectively capture an optical image of the target workpiece by using the plurality of light receiving elements, an accumulation unit configured to accumulate each pixel data of optical images captured by the plurality of sensors, for each pixel, and a comparison unit configured to compare the each pixel data accumulated for each pixel with predetermined reference data.

Moreover, in accordance with another aspect of the present invention, a pattern inspection method includes capturing optical images of a target workpiece to be inspected overlappingly by a sensor including a plurality of light receiving elements arrayed in a direction orthogonal to an inspection direction, at positions shifted each other by a pixel unit, accumulating each pixel data of the optical images overlappingly captured, for each pixel, and comparing the each pixel data accumulated for each pixel with predetermined reference data, and outputting a comparing result.

Furthermore, in accordance with another aspect of the present invention, a pattern inspection method includes arranging a plurality of sensors each including a plurality of light receiving elements arrayed in a direction orthogonal to an inspection direction, at positions shifted each other in the direction by a pixel unit of a number of elements fewer than a number of the plurality of light receiving elements, and capturing optical images of a target workpiece to be inspected, by using the plurality of sensors, accumulating each pixel data of the optical images captured by the plurality of sensors, for each pixel, and comparing the each pixel data accumulated for each pixel with predetermined reference data, and outputting a comparing result.

DETAILED DESCRIPTION OF THE INVENTION

Embodiment 1

Figure 1:
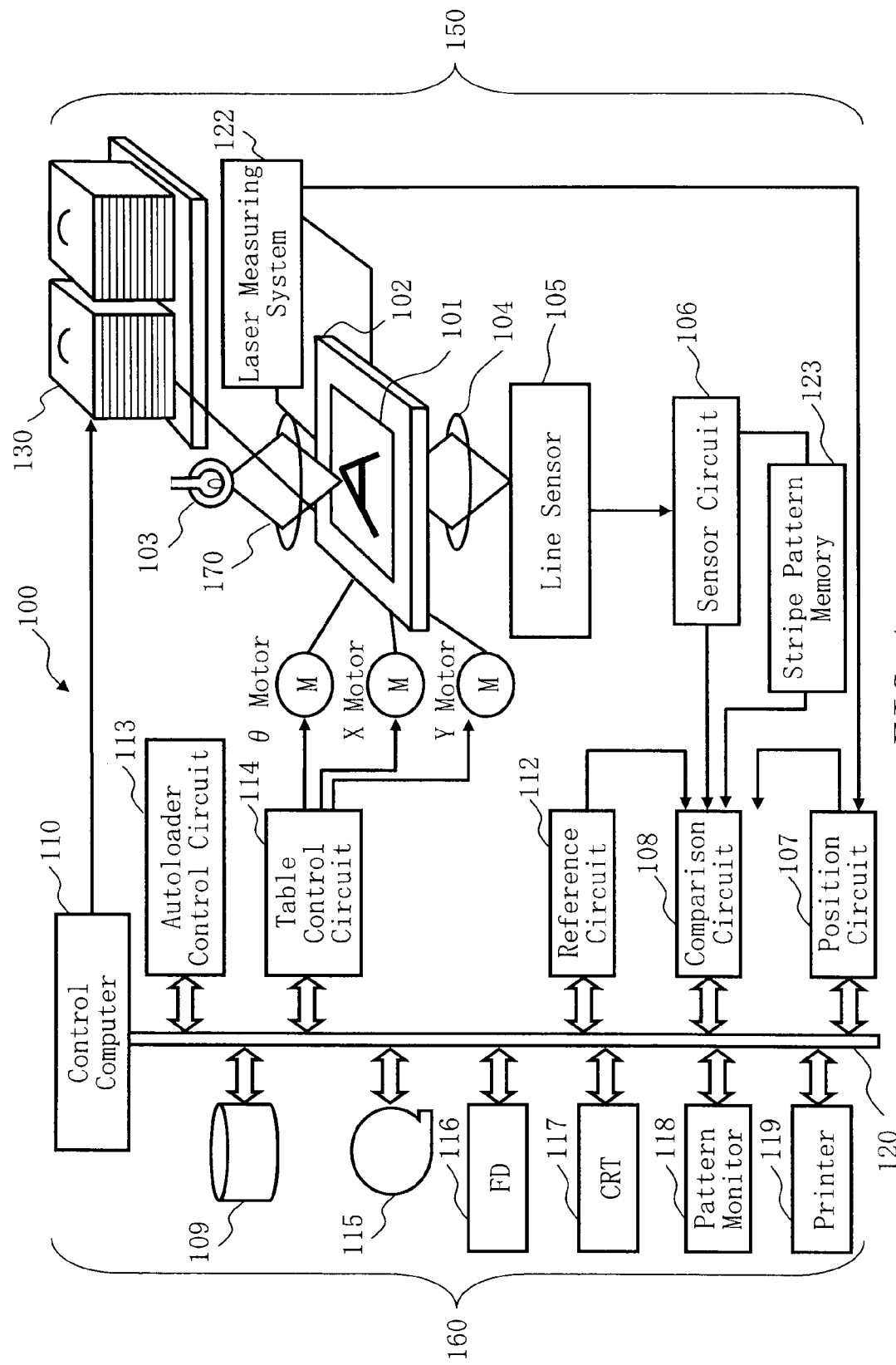
FIG. 1 shows a schematic diagram illustrating the structure of a pattern inspection apparatus according to Embodiment 1.

FIG. 1 shows a schematic diagram illustrating the structure of a pattern inspection apparatus described in Embodiment 1. In FIG. 1, an inspection apparatus 100 for inspecting defects of a target workpiece, for example a mask, includes an optical image acquisition unit 150 and a control system circuit 160. The optical image acquisition unit 150 includes a light source 103, an XYθ table 102, an illumination optical system 170, a magnifying optical system 104, a line sensor 105, a sensor circuit 106, a laser measuring system 122, and an autoloader 130. In the control system circuit 160, a control computer 110 serving as a computer is connected, through a bus 120, to a position circuit 107, a comparison circuit 108, a reference circuit 112, an autoloader control circuit 113, a table control circuit 114, a magnetic disk drive 109, a magnetic tape drive 115, a flexible disk drive (FD) 116, a CRT 117, a pattern monitor 118, and a printer 119. Moreover, the sensor circuit 106 is connected to a stripe pattern memory 123 which is connected to the comparison circuit 108. The XYθ table 102, which is an example of the stage, is driven by an X-axis motor, a Y-axis motor, and a θ-axis motor. FIG. 1 depicts structure elements necessary for describing Embodiment 1, and it should be understood that other structure elements generally necessary for the inspection apparatus 100 may be included therein.

In the inspection apparatus 100, an inspection optical system of large magnification is composed of the light source 103, the XYθ table 102, the illumination optical system 170, the magnifying optical system 104, the line sensor 105, and the sensor circuit 106. The XYθ table 102 is driven by the table control circuit 114 under the control of the control computer 110. The XYθ table 102 can be moved by a drive system such as a three-axis (X-Y-θ) motor, which drives the XYθ table 102 in the X direction, the Y direction, and the θ direction. For example, a step motor can be used as these X, Y, and θ motors. The moving position of the XYθ table 102 is measured by the laser length measurement system 122 and supplied to the position circuit 107. A photomask 101 on the XYθ table 102 is automatically conveyed from the autoloader 130 driven by the autoloader control circuit 113, and automatically ejected after the inspection.

The photomask 101 serving as a target workpiece to be inspected, or "inspection sample" is placed on the XYθ table 102 which is movable in a horizontal direction and a rotating direction by the X-, Y-, and θ-axis motors. Then, the pattern written on the photomask 101 is irradiated by continuous light emitted from a suitable light source 103, thorough the illumination optical system 170. The light penetrated the photomask 101 is focused, through the magnifying optical system 104, on the line sensor 105 as an optical image, and enters in it.

Figure 2:
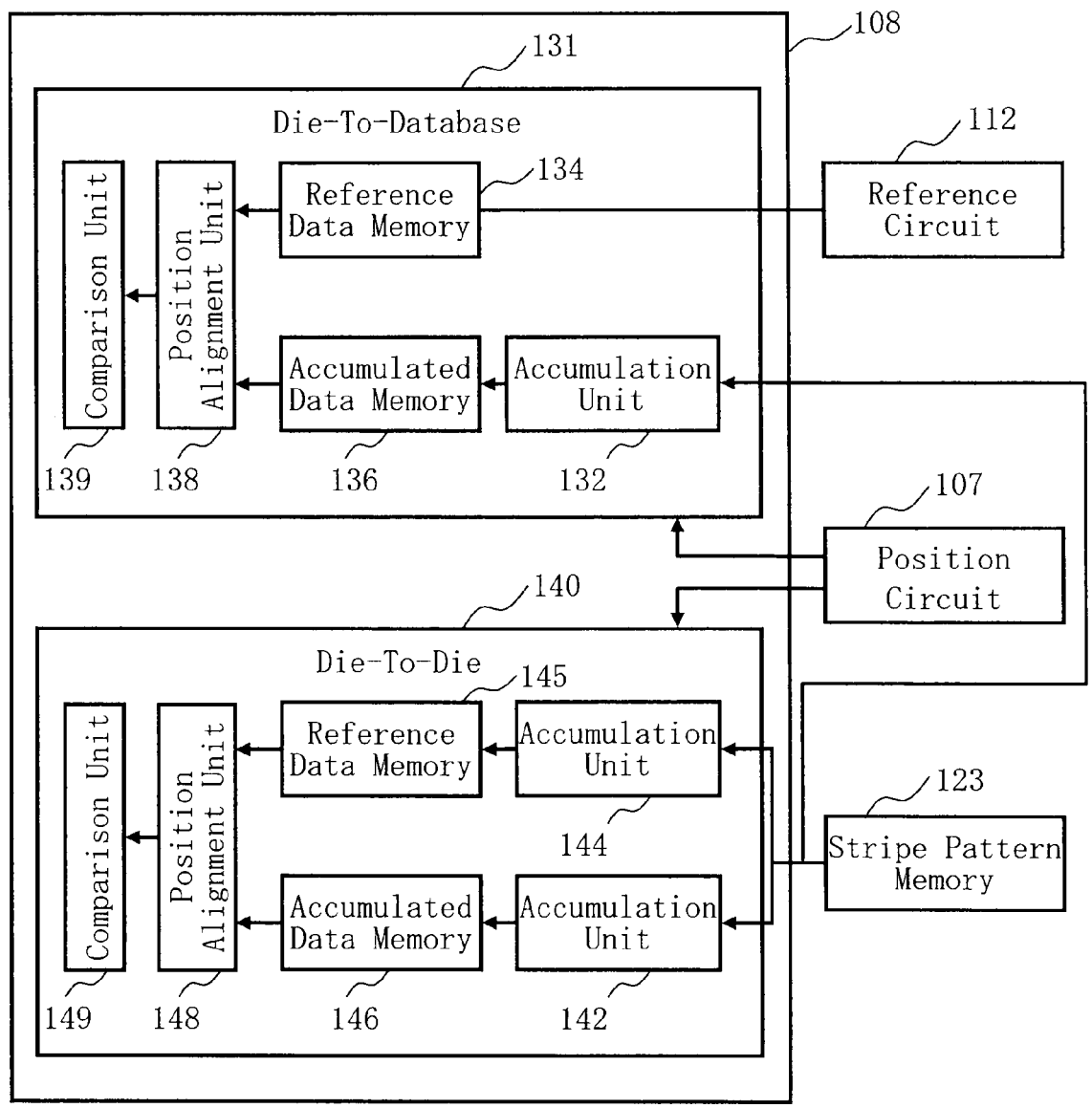
FIG. 2 shows a schematic diagram illustrating the internal structure of a comparison circuit according to Embodiment 1.

FIG. 2 shows a schematic diagram illustrating the internal structure of the comparison circuit described in Embodiment 1. In FIG. 2, a die-to-database comparison circuit 131 which performs die-to-database inspection, and a die-to-die comparison circuit 140 which performs die-to-die inspection are arranged in the comparison circuit 108. In the die-to-database comparison circuit 131, an accumulation unit 132, a reference data memory 134, an accumulated data memory 136, a position alignment unit 138, and a comparison unit 139 are arranged. On the other hand, in the die-to-die comparison circuit 140, accumulation units 142 and 144, accumulation data memories 145 and 146, a position alignment unit 148, and a comparison unit 149 are arranged.

Figure 3:
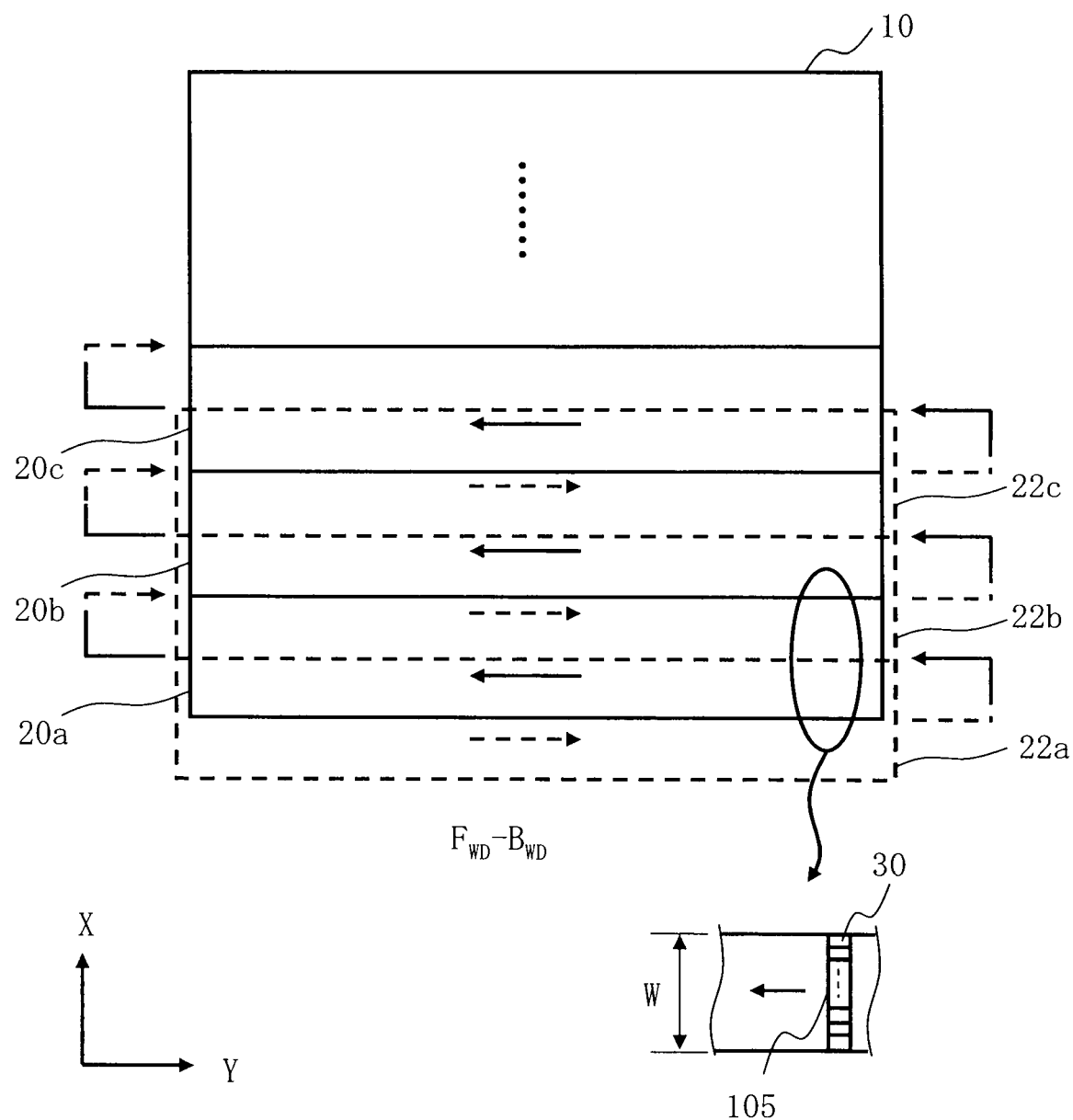
FIG. 3 shows a schematic diagram for illustrating a procedure of acquiring an optical image according to Embodiment 1.

FIG. 3 shows a schematic diagram for illustrating a procedure of acquiring an optical image according to Embodiment 1. An inspection region 10 is virtually divided, for example, in the direction of X as indicated by the arrow as shown in FIG. 3 into a plurality of strip-like inspection stripes 20 each having of a scanning width W. The operation of the XYθ table 102 is controlled so that each divided inspection stripe 20 (or inspection stripe 22) may be scanned continuously. An optical image is acquired while the line sensor 105 continuously moves relatively in the Y direction (first direction) as indicated by the arrow as shown in FIG. 3 with respect to movement of the XYθ table 102. The line sensor 105 continuously captures optical images each having a scanning width W as shown in FIG. 3. According to Embodiment 1, after capturing an optical image in one inspection stripe 20 (or inspection stripe 22), another optical image of the scanning width W is similarly captured continuously at a position shifted in the X direction by ½ of the scanning width W while the line sensor 105 relatively moves, with respect to movement of the XYθ table 102, in a direction reverse to the direction of the last image-capturing. That is, image capturing is repeated in the forward and backward direction, meaning going in a reverse direction when advancing and returning. Specifically, after capturing an image in an inspection stripe 22a, which includes ½ of the scanning width W of a first inspection stripe 20a, in the direction of Y as an inspection direction, the line sensor 105 relatively moves, with respect to movement of the XYθ table 102, in the X direction by ½ of the scanning width W to capture an image in the inspection stripe 20a in the −Y direction as an inspection direction. Next, after the line sensor 105 relatively moves, with respect to movement of the XYθ table 102, in the X direction by ½ of the scanning width W, an image in an inspection stripe 22b is captured in the Y direction as an inspection direction. Next, after the line sensor 105 relatively moves, with respect to movement of the XYθ table 102, in the X direction by ½ of the scanning width W, an image in an inspection stripe 20b is captured in the −Y direction as an inspection direction. Next, after the line sensor 105 relatively moves, with respect to movement of the XYθ table 102, in the X direction by ½ of the scanning width W, an image in an inspection stripe 22c is captured in the Y direction as an inspection direction. Next, after the line sensor 105 relatively moves, with respect to movement of the XYθ table 102, in the X direction by ½ of the scanning width W, an image in an inspection stripe 20c is captured in the −Y direction as an inspection direction. Thus, images are acquired continuously while the line sensor 105 relatively shifts, with respect to movement of the XYθ table 102, by ½ of the scanning width W. Thereby, the inspection region 10 is overlappingly image-captured by the line sensor 105 while the line sensor 105 relatively shifts, with respect to movement of the XYθ table 102, by ½ of the scanning width W when advancing and returning. For example, if the line sensor 105 in which a plurality of light receiving elements 30 (photodiodes) for 2048 pixels are arrayed in the X direction (second direction) orthogonal to the inspection direction (Y direction) is used, the scanning width W becomes 2048 pixels. Then, by shifting these light receiving elements 30 by a pixel unit, an image in the next inspection stripe is captured.

Figure 4:
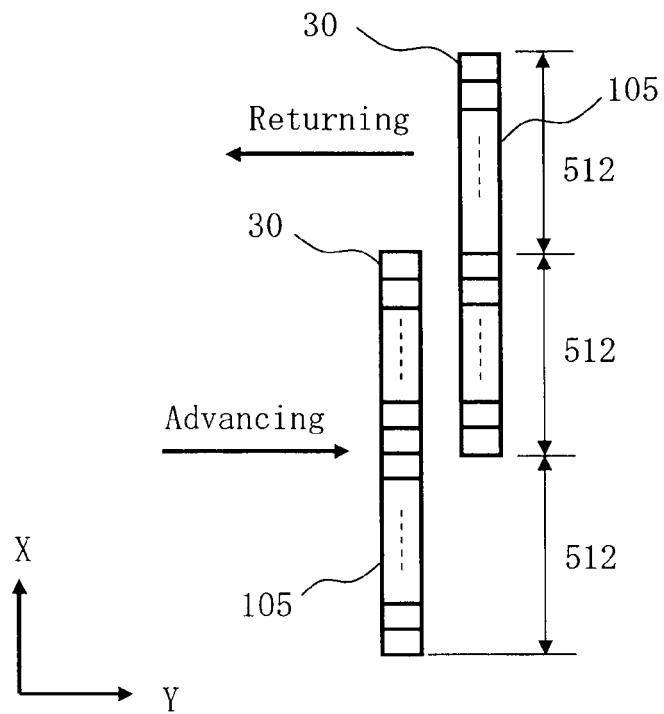
FIG. 4 shows a schematic diagram illustrating an example of how to shift a line sensor according to Embodiment 1.

FIG. 4 shows a schematic diagram illustrating an example of how to shift the line sensor described in Embodiment 1. In FIG. 4, when the line sensor 105 in which a plurality of light receiving elements 30 for 1024 pixels are arrayed in a line in the X direction is used, image-capturing is performed at the positions shifted by 512 pixels each other in the X direction when advancing and returning. Thus, it is preferable for each pixel data to be image-captured overlappingly at the positions shifted by ½ of the number of the plurality of light receiving elements 30. However, it is not limited to ½. It is acceptable to shift in the X direction by a pixel unit of the number of elements fewer than the number of the plurality of light receiving elements 30. By virtue of this, each pixel of the inspection region 10 is image-captured overlappingly.

Figure 5:
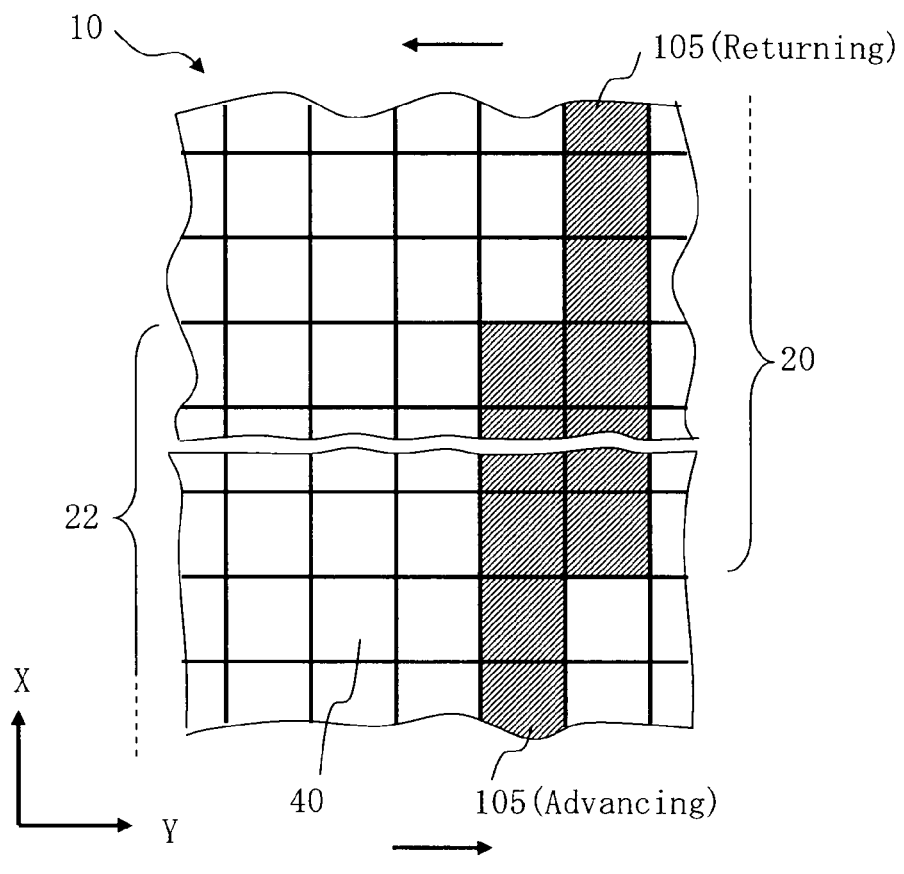
FIG. 5 shows a schematic diagram for illustrating pixels image-captured by shifting a line sensor according to Embodiment 1.

FIG. 5 shows a schematic diagram for illustrating pixels image-captured by shifting the line sensor described in Embodiment 1. In the advancing, each pixel 40 in a certain inspection stripe 22 is image-captured by each light receiving element 30 of the line sensor 105. In the returning, each pixel 40 in the inspection stripe 20 shifted in the X direction by a pixel unit of the number of elements fewer than the number of the plurality of light receiving elements 30 is image-captured by each light receiving element 30 of the line sensor 105. Therefore, for example, when shifted by ½ of the number of elements, each pixel 40 is image-captured twice respectively. When shifted by ¼ of the number of elements, each pixel 40 is image-captured four times respectively. If the number of times of overlapping is increased, inspection time will become long. Therefore, it is preferable for each pixel data to be shifted by ½ of the number of the plurality of light receiving elements 30.

Thereby, the same pixel position can be image-captured by different light receiving elements 30. Since it is shifted by a pixel unit, even if the light receiving element 30 at the sensor end is used in one image-capturing, a light receiving element 30 at the inner side being different from the sensor end can be used in the other image-capturing.

The pattern image focused on the line sensor 105 is photoelectrically converted by each light receiving element 30 of the line sensor 105, and further A/D (analog digital) converted by the sensor circuit 106. Pixel data is stored in the stripe pattern memory 123 of each inspection stripe 20 (22). Then, the pixel data is sent to the comparison circuit 108 with the data indicating the position of the photo mask 101 on the XYθ table 102 output from the position circuit 107. The measurement data is 8-bit unsigned data, for example, and indicates a gray level (light quantity) of brightness of each pixel.

First, the case of die-to-database inspection will be described as follows: The accumulation unit 132 inputs pixel data from the stripe pattern memory 123 in each inspection stripe 20 and each inspection stripe 22. Then, the accumulation unit 132 accumulates (accumulative addition) each pixel data, which has been overlappingly image-captured, per pixel. The obtained accumulated data is stored in the accumulated data memory 136. On the other hand, the reference circuit 112 first reads design data from the magnetic disk drive 109 through the control computer 110. Then, the read design data of the photomask 101 is converted into image data of binary values or multiple values to generate reference data (reference image). The reference data is stored in the reference data memory 134. The reference data is generated as data which has been accumulatively added by the same times as that of accumulative addition of the pixel data used as measurement data.

In the position alignment unit 138, position alignment is first performed between the measurement data and the reference data in which pixel data is accumulated. The comparison unit 139 compares each pixel data of the measurement data with reference pixel data of the reference data according to a predetermined algorithm, and judges existence of a defect, based on the comparison result. Then, the comparison result is output, for example, to the magnetic disk drive 109, magnetic tape drive 115, FD 116, CRT 117, pattern monitor 118, or printer 119. Alternatively, it may be output to the outside.

The case of die-to-die inspection will be described as follows: After the measurement data (reference image) of a reference target workpiece or "sample to be referred to", which has been image-captured with the inspection target workpiece, is stored in the stripe pattern memory 123 of each inspection stripe 20 and each inspection stripe 22, the measurement data is sent to the comparison circuit 108, with data indicating the position of the photomask 101 on the XYθ table 102 output from the position circuit 107. The accumulation unit 142 inputs pixel data of the inspection target workpiece from the stripe pattern memory 123 in each inspection stripe 20 and each inspection stripe 22. Then, the accumulation unit 142 accumulates (accumulative addition) each pixel data, which has been overlappingly image-captured, per pixel. The obtained accumulated data is stored in the accumulated data memory 146. On the other hand, the accumulation unit 144 inputs pixel data of the reference target workpiece from the stripe pattern memory 123 of each inspection stripe 20 and each inspection stripe 22. Then, the accumulation unit 144 accumulates (accumulative addition) each pixel data, which has been overlappingly image-captured, per pixel. The obtained accumulated data is stored in the accumulated data memory 145.

In the position alignment unit 148, position alignment is first performed between the measurement data and the reference data in which pixel data is accumulated. The comparison unit 149 compares each pixel data of the measurement data with reference pixel data of the reference data according to a predetermined algorithm, and judges existence of a defect, based on the comparison result. Then, the comparison result is output, for example, to the magnetic disk drive 109, magnetic tape drive 115, FD 116, CRT 117, pattern monitor 118, or printer 119. Alternatively, it may be output to the outside.

As mentioned above, since the pixel data image-captured by a different light receiving element 30 is accumulated in each pixel, property variation among elements can be averaged. Specifically, since the pixel data image-captured by the light receiving element 30 at the sensor end is accumulated with the pixel data image-captured by the light receiving element 30 at the inner side, namely not at the end, it is possible to reduce the variation at the sensor end. Therefore, errors of measurement data can be suppressed. Consequently, accuracy of inspection can be increased.

In the example mentioned above, as a procedure of acquiring an optical image, it is structured so that image-capturing is repeated in the forward and backward direction, meaning going in a reverse direction when advancing and returning, but it is not limited thereto.

Figure 6:
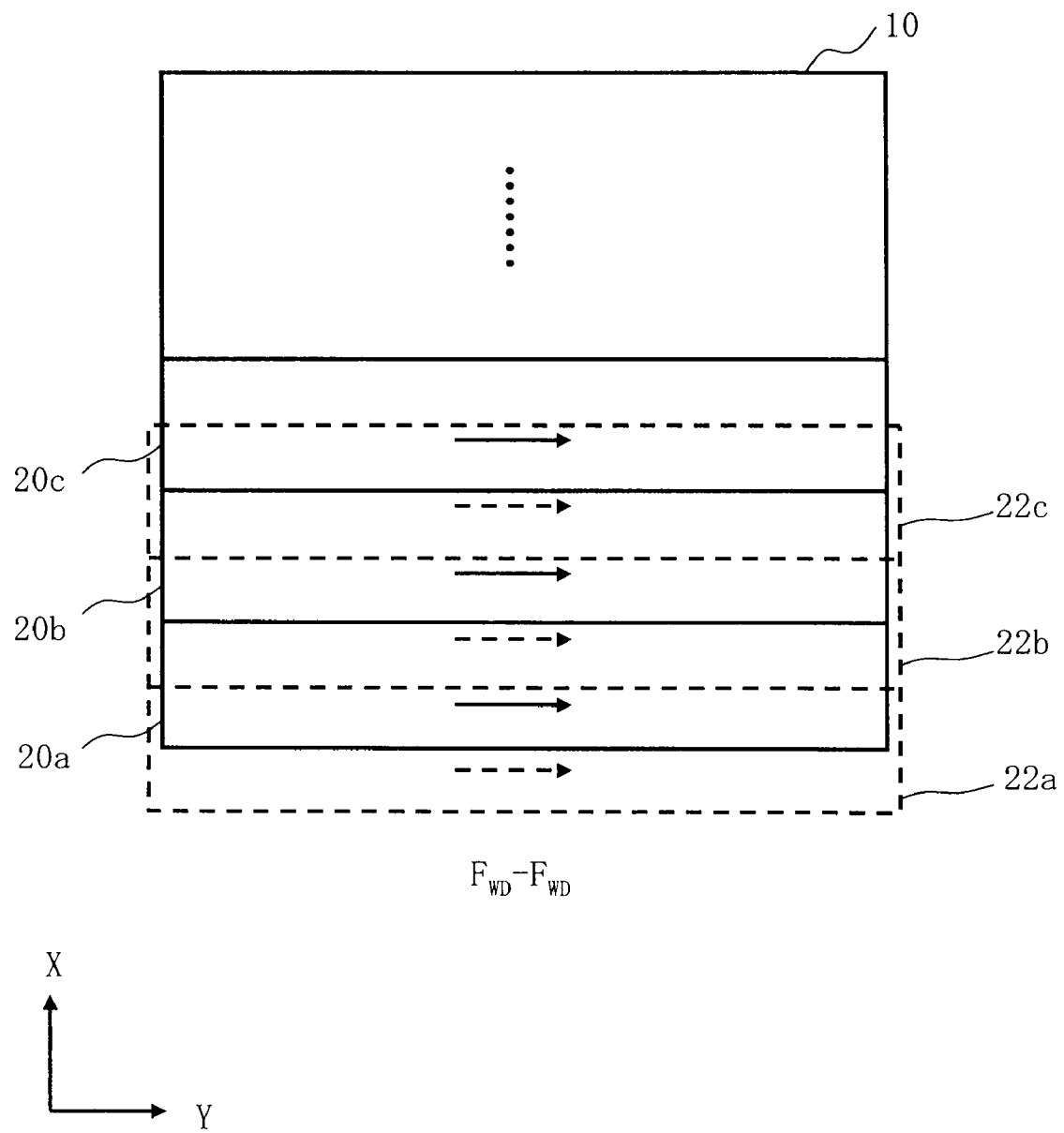
FIG. 6 shows a schematic diagram for illustrating other procedure of acquiring an optical image according to Embodiment 1.

FIG. 6 shows a schematic diagram for illustrating other procedure of acquiring an optical image according to Embodiment 1. In FIG. 6, after capturing an optical image in one inspection stripe 20 (or inspection stripe 22), the line sensor 105 relatively goes back, with respect to movement of the XYθ table 102, to the original position and then goes to a position shifted in the X direction by ½ of the scanning width W, or after going to a position shifted in the X direction by ½ of the scanning width W, the line sensor 105 relatively returns in the direction of −Y to the original position so that an optical image of the scanning width W in the next inspection stripe 22 (or inspection stripe 20) may be captured continuously while the line sensor 105 relatively moves, with respect to movement of the XYθ table 102, in the same Y direction as the last time. Thus, when getting the image of the target, it is preferable that image capturing is overlappingly performed in one direction toward which the XYθ table 102 and the target workpiece relatively move. That is, image capturing is repeated in the forward and forward direction, meaning going in the same direction when getting the image of the target. In this case, if the moving locus of the XYθ table 102 curves or zigzags due to an orthogonal error or a moving linear error, the optical image acquired will also be curved or zigzag along the moving locus which is curved or zigzag. If the coordinate system is corrected in one direction, the manner of curving or zigzagging will be changed when the image-capturing is performed in a reverse direction. Therefore, an error may become large. That is, an error can be made small by performing image-capturing in the same direction when getting the image of the target. Specifically, after capturing an image in the inspection stripe 22a including ½ of the scanning width W of the first inspection stripe 20a in the Y direction as the inspection direction, the line sensor 105 relatively, with respect to movement of the XYθ table 102, returns to the original position and moves in the X direction by ½ of the scanning width W, and then captures an image in the inspection stripe 20a in the Y direction again as the inspection direction. Next, after returning to the original position, where the capturing of the image in the inspection stripe 20a is started, the line sensor 105 relatively moves, with respect to movement of the XYθ table 102, in the X direction by ½ of the scanning width W, and then captures an image in the inspection stripe 22b in the Y direction as the inspection direction. Next, after returning to the original position, where the capturing of the image in the inspection stripe 22b is started, the line sensor 105 relatively moves, with respect to movement of the XYθ table 102, in the X direction by ½ of the scanning width W, and then captures an image in the inspection stripe 20b in the Y direction as the inspection direction. Next, after returning to the original position, where the capturing of the image in the inspection stripe 20b is started, the line sensor 105 relatively moves, with respect to movement of the XYθ table 102, in the X direction by ½ of the scanning width W, and then captures an image in the inspection stripe 22c in the Y direction as the inspection direction. Next, after returning to the original position, where the capturing of the image in the inspection stripe 22c is started, the line sensor 105 relatively moves, with respect to movement of the XYθ table 102, in the X direction by ½ of the scanning width W, and then captures an image in the inspection stripe 20c in the Y direction as the inspection direction. Thus, images are acquired continuously while the line sensor 105 relatively shifts, with respect to movement of the XYθ table 102, in one direction by ½ of the scanning width W. Thereby, the inspection region 10 is overlappingly image-captured by the line sensor 105 while the line sensor 105 relatively shifts, with respect to movement of the XYθ table 102, in one direction by ½ of the scanning width W when getting the image of the target.

Figure 7:
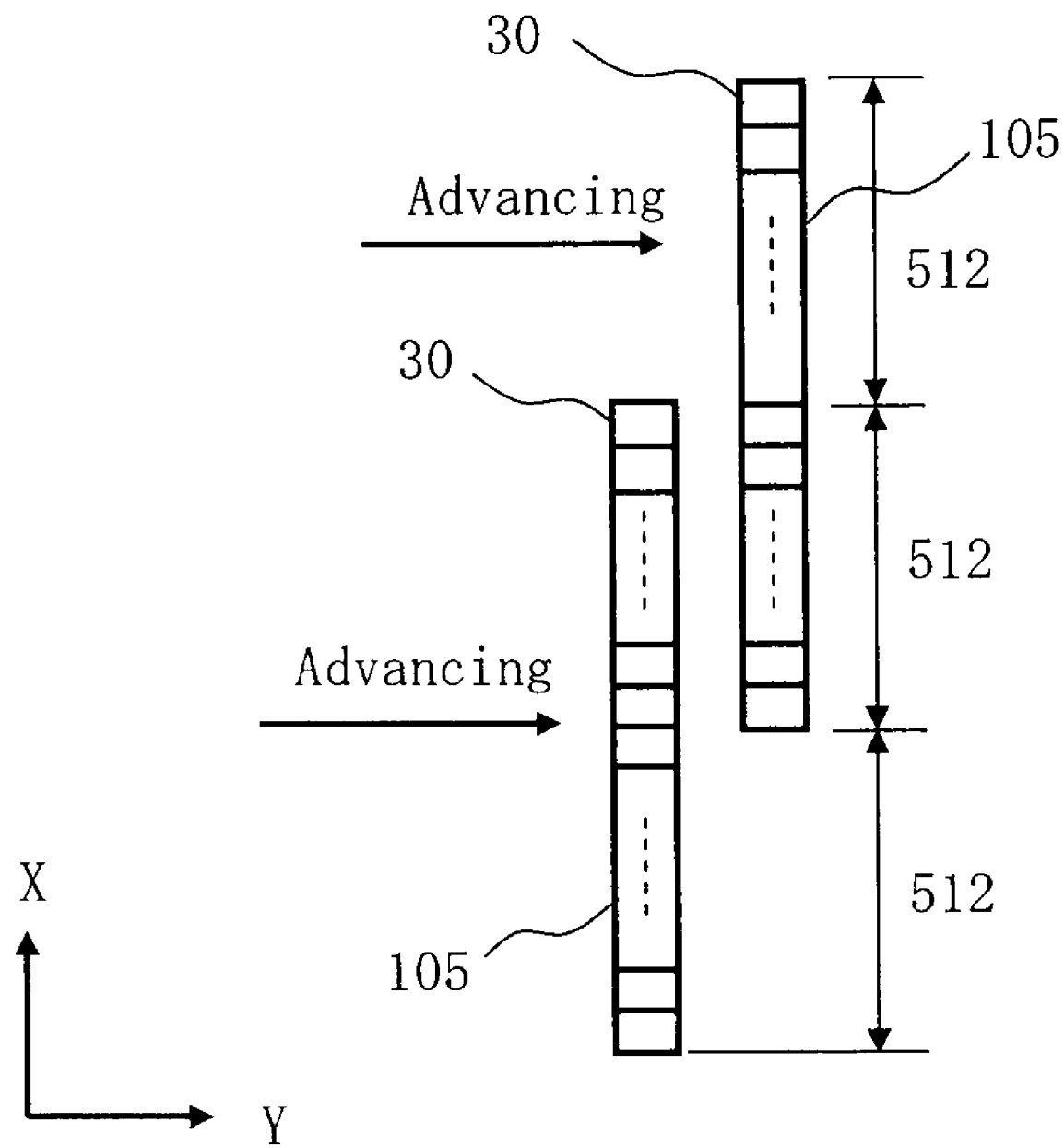
FIG. 7 shows a schematic diagram illustrating an example of how to shift a line sensor in the case of going in the same direction when getting the image of the target.

FIG. 7 shows a schematic diagram illustrating an example of how to shift the line sensor in the case of going in the same direction when advancing and returning described in Embodiment 1. In FIG. 7, when the line sensor 105 in which a plurality of light receiving elements 30 for 2048 pixels are arrayed in a line in the X direction is used, image-capturing is performed at the positions shifted by 512 pixels each other in the X direction when getting the image of the target. As also mentioned above, it is not limited to ½ of the number of the plurality of light receiving elements 30. It is acceptable to shift in the X direction by a pixel unit of the number of elements fewer than the number of the plurality of light receiving elements 30. By virtue of this, each pixel of the inspection region 10 is image-captured overlappingly.

Embodiment 2

Although image capturing is performed overlappingly by one sensor in Embodiment 1, it is not limited thereto. The case of using a plurality of sensors will be described in Embodiment 2.

Figure 8:
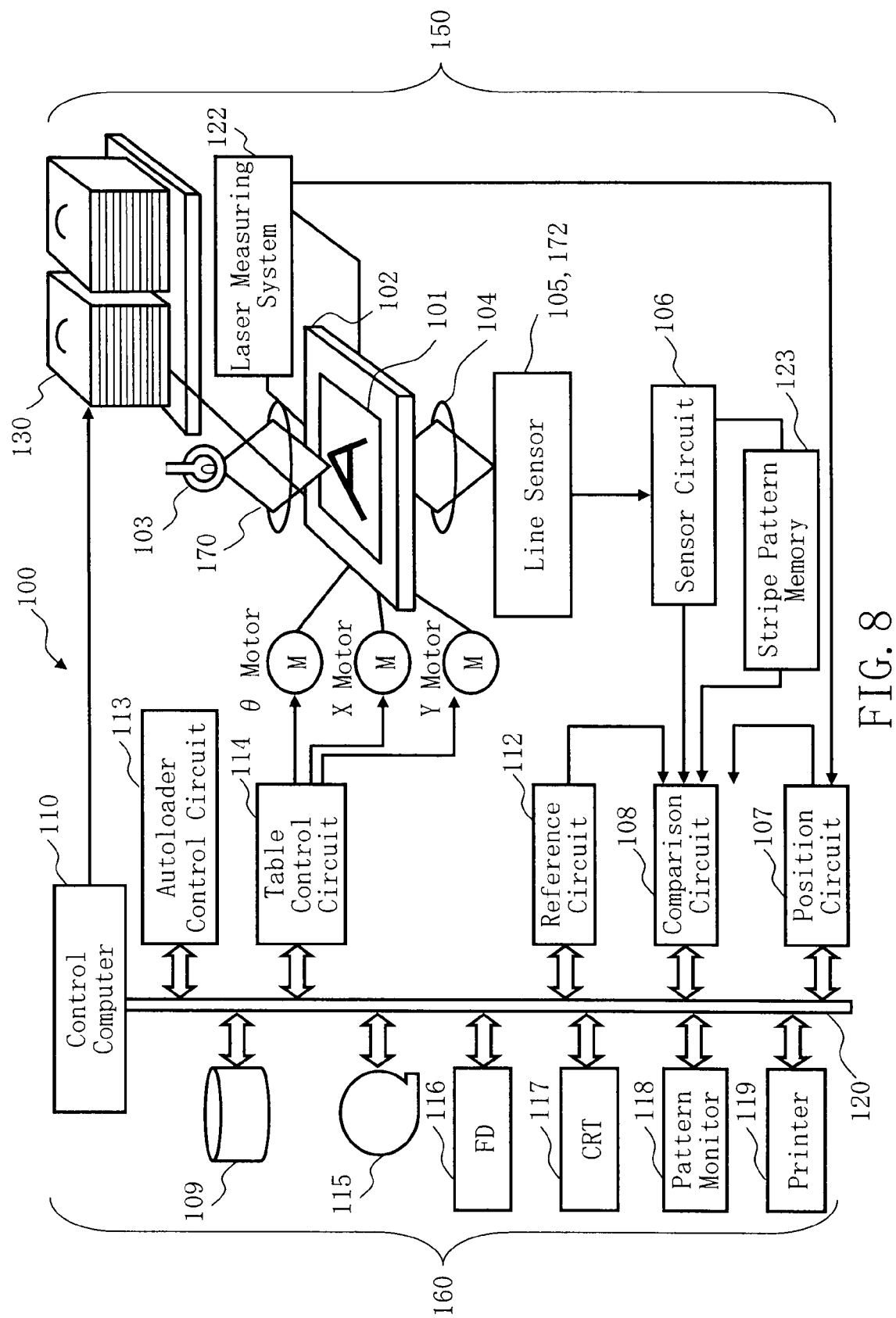
FIG. 8 shows a schematic diagram illustrating the structure of a pattern inspection apparatus according to Embodiment 2.

FIG. 8 shows a schematic diagram illustrating the structure of a pattern inspection apparatus described in Embodiment 2. FIG. 8 is similar to FIG. 1, except that a line sensor 172 is added.

Figure 9:
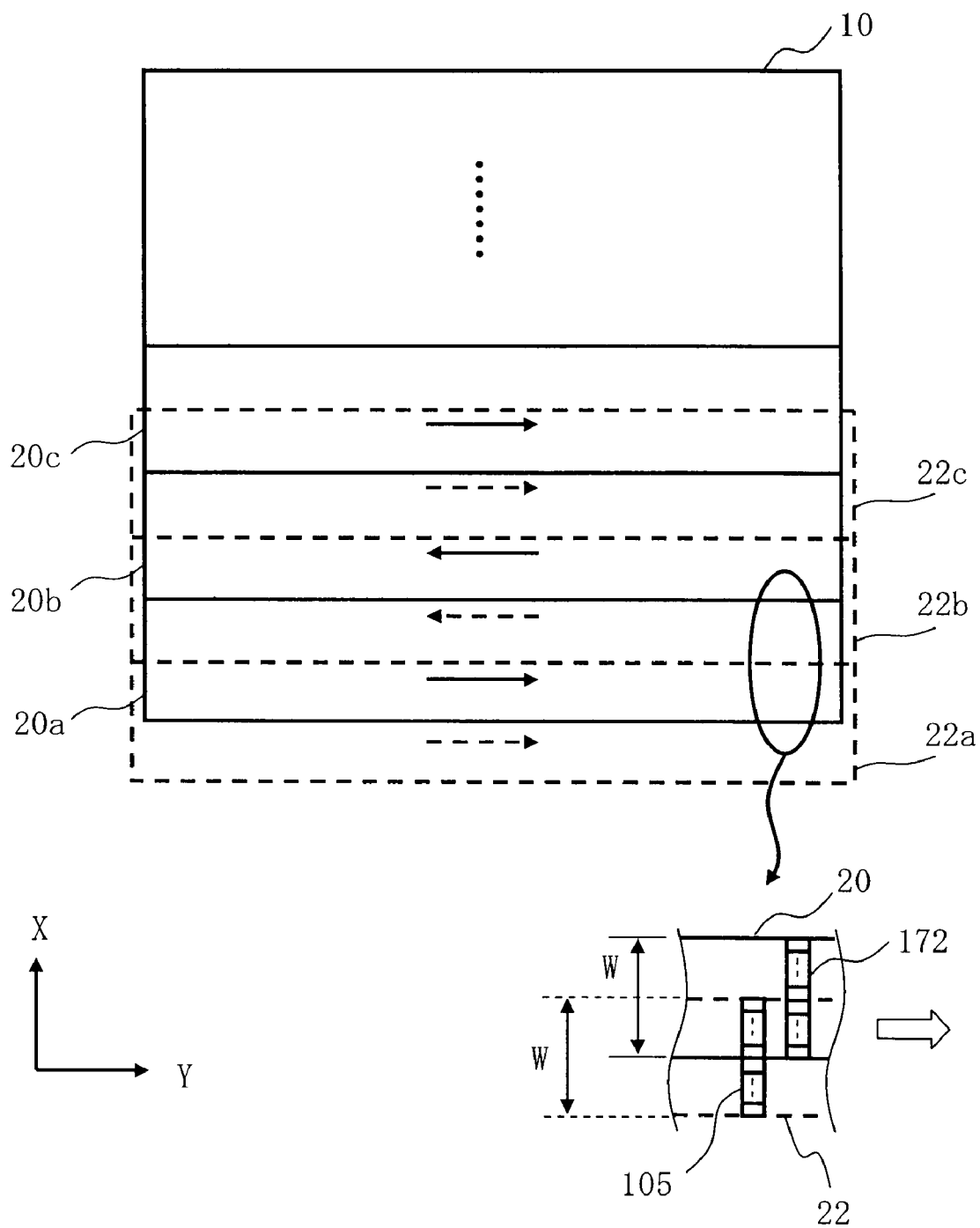
FIG. 9 shows a schematic diagram for illustrating a procedure of acquiring an optical image according to Embodiment 2.

FIG. 9 shows a schematic diagram for illustrating a procedure of acquiring an optical image according to Embodiment 2. An optical image is acquired while the line sensors 105 and 172 relatively move in the Y direction (first direction) continuously with respect to the movement of the XYθ table 102. The line sensors 105 and 172 continuously capture optical images each having a scanning width W respectively as shown in FIG. 9. In Embodiment 2, after simultaneously or substantially simultaneously capturing an optical image in one inspection stripe 20 (or inspection stripe 22) and an optical image in another inspection stripe 22 (or inspection stripe 20) shifted in the X direction by ½ of the scanning width W, the line sensors 105 and 172 continuously capture optical images each having a scanning width W respectively at the position shifted in the X direction by the scanning width W while the line sensors 105 and 172 relatively move, with respect to the movement of the XYθ table 102, in a direction reverse to the direction of the last image-capturing. That is, image capturing is repeated in the forward and backward direction, meaning going in a reverse direction when advancing and returning.

Figure 10:
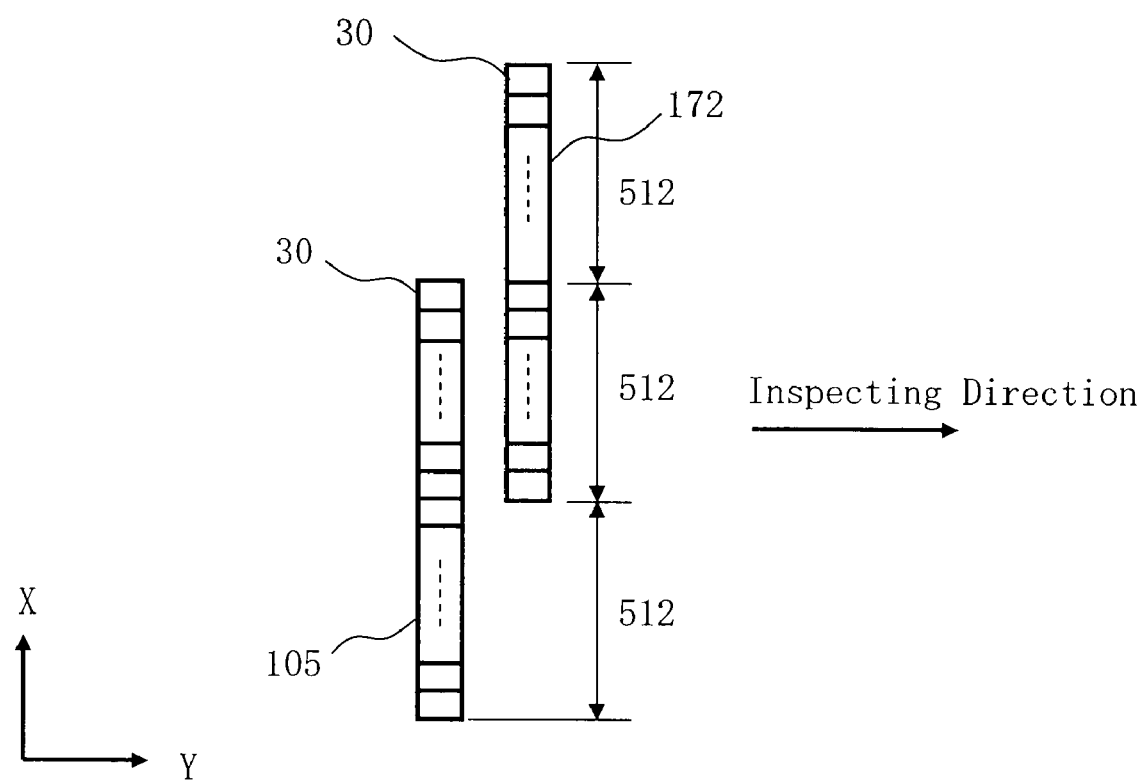
FIG. 10 shows a schematic diagram illustrating an example of how to shift the line sensors according to Embodiment 2.

FIG. 10 shows a schematic diagram illustrating an example of how to shift the line sensors described in Embodiment 2. In FIG. 10, when the line sensors 105 and 172 in which a plurality of light receiving elements 30 for 1024 pixels are arrayed in a line in the X direction are used, the line sensors 105 and 172 are arranged at the positions shifted each other in the X direction by 512 pixels. Then, image-capturing is performed in a state of keeping such arrangement position. Thus, it is preferable for each pixel data of the optical images to be captured overlappingly by the two line sensors 105 and 172 shifted each other by ½ of the number of the plurality of light receiving elements 30. However, it is not limited to ½. It is acceptable for the line sensors 105 and 172 to be arranged at the positions shifted each other in the X direction by a pixel unit of the number of elements fewer than the number of the plurality of light receiving elements 30 included in the line sensors 105 and 172. By virtue of this, each pixel of the inspection region 10 is image-captured overlappingly.

Specifically, after the line sensor 105 captures an image in the inspection stripe 22a including ½ of the scanning width W of the first inspection stripe 20a in the Y direction and the line sensor 172 captures an image in the first inspection stripe 20a also in the Y direction as the inspection direction, they are moved in the X direction by the scanning width W. Then, the line sensor 105 captures an image in the inspection stripe 22b in the −Y direction and the line sensor 172 captures an image in the inspection stripe 20b also in the −Y direction as the inspection direction. Next, after moving in the X direction by the scanning width W, the line sensor 105 captures an image in the inspection stripe 22c in the Y direction and the line sensor 172 captures an image in the inspection stripe 20c also in the Y direction as the inspection direction. Thus, images are continuously acquired by using the two line sensors 105 and 172 arranged at the positions shifted each other by ½ of the scanning width W. Thereby, the inspection region 10 is overlappingly image-captured by the two line sensors 105 and 172. Although two line sensors are used in this case, it should be understood that three or more line sensors may be used.

As mentioned above, it is also preferable to image capture the same pixel position by using a plurality of sensors. Thereby, the same pixel position can be image-captured by different light receiving elements. Since it is shifted by a pixel unit, even if the element at the sensor end is used in one sensor, a light receiving element not at the end is used in the other sensor.

The pattern images focused on the line sensors 105 and 172 are photoelectrically converted by each light receiving element 30 of the line sensors 105 and 172, and further A/D (analog digital) converted by the sensor circuit 106. Pixel data is stored in the stripe pattern memory 123 of each inspection stripe 20 (22). Then, the pixel data is sent to the comparison circuit 108 with the data indicating the position of the photo mask 101 on the XYθ table 102 output from the position circuit 107. Each pixel data image-captured by a plurality of sensors in the comparison circuit 108 is accumulated in each pixel. The subsequent steps are the same as those in Embodiment 1.

Although the line sensor is used in each Embodiment mentioned above, it is also acceptable to use a two-dimensional sensor (ex. TDI sensor) in which light receiving elements are arrayed two-dimensionally. Even when the two-dimensional sensor is used, each pixel data is accumulated in each pixel. Even in such a case, since it is shifted by a pixel unit, even if the element at the sensor end is used in one sensor, a light receiving element not at the end can be used in the other sensor. Therefore, property variation at the end can be specially reduced.

In the above description, what is represented as the "unit" or "circuit" can be configured by computer programs. They may be implemented by software programs executed by the computer system. Alternatively, they may be executed by a combination of software and hardware, or a combination of software, hardware and/or firmware. When constituted by a program, the program is stored in a recording medium, such as the magnetic disk drive 109, the magnetic tape drive 115, the FD 116, or the ROM (Read Only Memory). For example, each circuit, etc. in the autoloader control circuit 113, the table control circuit 114, the reference circuit 112, the comparison circuit 108, and the position circuit 107 that constitute an operation control unit may be configured by electric circuits. Alternatively, they may be executed as software to be processed by the control computer 110, or executed by a combination of electric circuits and software.

While the embodiments have been described with reference to specific examples, the present invention is not restricted to these specific ones. For example, it is acceptable for the light receiving element described above to be structured to take whichever of a transfer image or a reflective image of the inspection target workpiece. Moreover, the present invention is also effective to the structure of including a plurality of light receiving elements for simultaneously or substantially simultaneously taking a transfer image and a reflective image.

While description of the apparatus structure, control method, etc. not directly required for explaining the present invention is omitted, it is possible to suitably select and use some or all of them when needed. For example, although the structure of the control unit for controlling the inspection apparatus 100 is not described, it should be understood that a necessary control unit structure can be selected and used appropriately.

In addition, any other pattern inspection apparatus and pattern inspection method that include elements of the present invention and that can be appropriately modified by those skilled in the art are included within the scope of the present invention.

Additional advantages and modification will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A pattern inspection apparatus comprising:
    a stage configured to mount a target workpiece to be inspected thereon;
    a sensor configured to include a plurality of light receiving elements arrayed in a second direction orthogonal to a first direction which moves relatively to the stage, and to capture optical images of the target workpiece by using the plurality of light receiving elements;
    an accumulation unit configured to accumulate each pixel data of the optical images overlappingly captured by the sensor at positions shifted each other in the second direction by a pixel unit, for each pixel; and
    a comparison unit configured to compare the each pixel data accumulated for each pixel with predetermined reference data.

2. The apparatus according to claim 1, wherein the each pixel data is obtained by overlappingly capturing the optical images at positions shifted each other by ½ of a number of the plurality of light receiving elements.

3. The apparatus according to claim 1, wherein the each pixel data is obtained by overlappingly capturing the optical images in one direction toward which the stage and the target workpiece move relatively.

4. A pattern inspection apparatus comprising:
    a stage configured to mount a target workpiece to be inspected thereon;
    a plurality of sensors configured to respectively include a plurality of light receiving elements arrayed in a second direction orthogonal to a first direction which moves relatively to the stage, to be arranged at positions shifted each other in the second direction by a pixel unit of a number of elements fewer than a number of the plurality of light receiving elements, and to respectively capture an optical image of the target workpiece by using the plurality of light receiving elements;
    an accumulation unit configured to accumulate each pixel data of optical images captured by the plurality of sensors, for each pixel; and
    a comparison unit configured to compare the each pixel data accumulated for each pixel with predetermined reference data.

5. The apparatus according to claim 4, wherein the each pixel data is obtained by overlappingly capturing the optical images at positions shifted each other by ½ of a number of the plurality of light receiving elements.

6. The apparatus according to claim 4, wherein the each pixel data is obtained by overlappingly capturing the optical images in one direction toward which the stage and the target workpiece move relatively.

7. A pattern inspection method comprising:
    capturing optical images of a target workpiece to be inspected overlappingly by a sensor including a plurality of light receiving elements arrayed in a direction orthogonal to an inspection direction, at positions shifted each other by a pixel unit;
    accumulating each pixel data of the optical images overlappingly captured, for each pixel; and
    comparing the each pixel data accumulated for each pixel with predetermined reference data, and outputting a comparing result.

8. The method according to claim 7, wherein the each pixel data is obtained by overlappingly capturing the optical images when the target workpiece moves in a same direction.

9. The method according to claim 7, wherein the each pixel data is obtained by overlappingly capturing the optical images when the target workpiece moves advancing and when it moves returning.

10. A pattern inspection method comprising:
    arranging a plurality of sensors each including a plurality of light receiving elements arrayed in a direction orthogonal to an inspection direction, at positions shifted each other in the direction by a pixel unit of a number of elements fewer than a number of the plurality of light receiving elements, and capturing optical images of a target workpiece to be inspected, by using the plurality of sensors;
    accumulating each pixel data of the optical images captured by the plurality of sensors, for each pixel; and
    comparing the each pixel data accumulated for each pixel with predetermined reference data, and outputting a comparing result.

* * * * *